(12) United States Patent
Wang et al.

(10) Patent No.: US 10,591,549 B2
(45) Date of Patent: Mar. 17, 2020

(54) SENSOR AND METHOD OF MAKING AND USING THE SAME

(71) Applicant: GM Global Technology Operations LLC, Detroit, MI (US)

(72) Inventors: Shuoqin Wang, Westlake, CA (US); Mark W. Verbrugge, Troy, MI (US); Charles W. Wampler, II, Birmingham, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 161 days.

(21) Appl. No.: 15/265,101

(22) Filed: Sep. 14, 2016

(65) Prior Publication Data

US 2018/0074128 A1    Mar. 15, 2018

(51) Int. Cl.
| | | |
|---|---|---|
| *G01R 31/382* | (2019.01) | |
| *G01R 31/374* | (2019.01) | |
| *G01R 31/00* | (2006.01) | |
| *G02B 6/02* | (2006.01) | |

(52) U.S. Cl.
CPC ......... *G01R 31/382* (2019.01); *G01R 31/007* (2013.01); *G01R 31/374* (2019.01); *G02B 6/02076* (2013.01)

(58) Field of Classification Search
None
See application file for complete search history.

(56) References Cited

U.S. PATENT DOCUMENTS

| | | | | |
|---|---|---|---|---|
| 6,363,180 B1* | 3/2002 | Yamate | ............... | G01D 5/344 |
| | | | | 356/35.5 |
| 2001/0043330 A1* | 11/2001 | Jung | ............... | G01J 1/06 |
| | | | | 356/419 |
| 2007/0075225 A1* | 4/2007 | Xia | ............... | G01N 21/7703 |
| | | | | 250/227.14 |
| 2011/0003279 A1* | 1/2011 | Patel | ............... | G01D 3/10 |
| | | | | 435/5 |
| 2013/0070235 A1* | 3/2013 | Chen | ............... | G01L 11/025 |
| | | | | 356/73 |
| 2014/0092375 A1* | 4/2014 | Raghavan | ............... | H01M 10/48 |
| | | | | 356/32 |
| 2014/0203783 A1* | 7/2014 | Kiesel | ............... | H01M 10/42 |
| | | | | 320/134 |

(Continued)

FOREIGN PATENT DOCUMENTS

| | | |
|---|---|---|
| CN | 201680924 U | 12/2010 |
| CN | 201780648 U | 3/2011 |

(Continued)

OTHER PUBLICATIONS

Chinese Office Action dated Sep. 2. 2019; Application No. 2017108077486; Applicant: GM Global Technology Operations LLC.; 7 pages.

*Primary Examiner* — Nasima Monsur
(74) *Attorney, Agent, or Firm* — BrooksGroup

(57) ABSTRACT

A number of variations may include a product comprising: at least one sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously.

16 Claims, 2 Drawing Sheets

(56) References Cited

U.S. PATENT DOCUMENTS

2014/0222343 A1* 8/2014 Samson ............... G01V 8/10
                                                    702/8
2015/0069996 A1* 3/2015 Imaoka ............... G01R 15/22
                                                    324/96

FOREIGN PATENT DOCUMENTS

| CN | 201903351 U | 7/2011 |
| CN | 202195825 U | 4/2012 |

* cited by examiner

SENSOR AND METHOD OF MAKING AND USING THE SAME

TECHNICAL FIELD

The field to which the disclosure generally relates to includes sensors for measuring conditions in electrochemical devices and methods of making and using the same.

BACKGROUND

In a number of variations, electrochemical devices may use a sensor to measure or aid in determining a property of the electrochemical device.

SUMMARY OF ILLUSTRATIVE VARIATIONS

A number of illustrative variations may include a product comprising: at least one sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously.

A number of illustrative variations may include a system comprising an electrochemical device, at least one sensor contacting or in close proximity to the electrochemical device, the sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously, and a controller operatively connected to the sensor wherein the controller is constructed and arranged to derive at least one of the temperature, state of charge, or state of power of the electrochemical device from at least one of the measurements provided by the sensor.

A number of illustrative variations may include a method comprising: providing an electrochemical device, at least one sensor contacting or in close proximity to an electrochemical device, the sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously, and a controller operatively connected to the sensor wherein the controller is constructed and arranged to derive at least one of the temperature, state of charge, or state of power of the electrochemical device from at least one of the measurements provided by the sensor; determining the measurements that derive both state of charge and temperature of the electrochemical device through the sensor; transmitting the measurements of the electrochemical device from the sensor to the controller; and deriving at least one of the temperature, state of charge and state of power of the electrochemical device through the controller.

Other illustrative variations within the scope of the invention will become apparent from the detailed description provided hereinafter. It should be understood that the detailed description and specific examples, while disclosing variations within the scope of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

The following description of the variations is merely illustrative in nature and is in no way intended to limit the scope of the invention, its application, or uses.

Techniques and technologies may be described herein in terms of functional and/or logical block components and various processing steps. It should be appreciated that such block components may be realized by any number of hardware, software, and/or firmware components configured to perform the specified functions. For example, an embodiment of a product, a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that variations may be practiced in conjunction with any number of data transmission protocols.

For the sake of brevity, conventional techniques related to hybrid and electric vehicle operation, electrochemical device operation, electrochemical device diagnostics, vehicle computing modules, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a number of variations of the subject matter.

Figure 1:
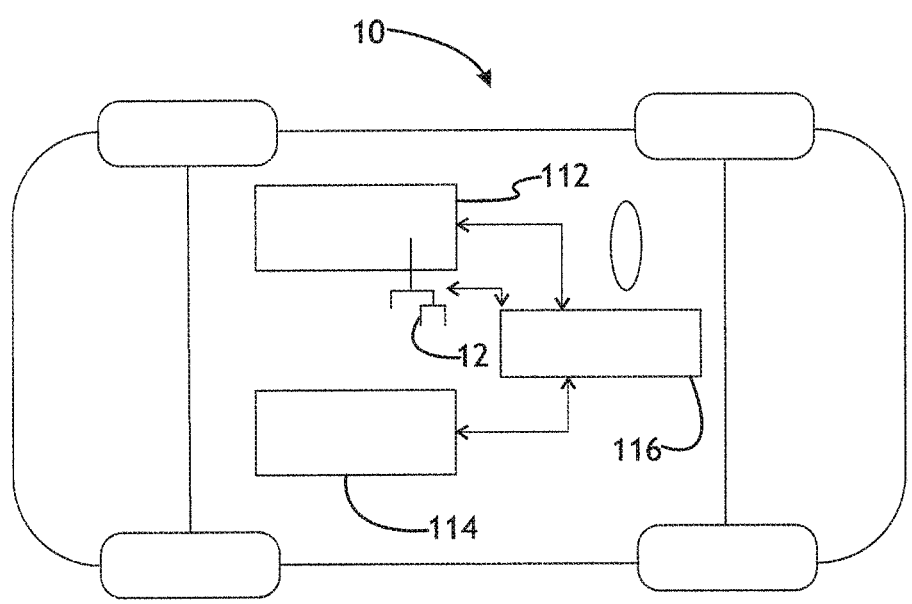
FIG. 1 illustrates a simplified plan view of a product comprising a vehicle including a sensor, an electrochemical device, a controller, and a main power source according to a number of variations.

FIG. 1 illustrates a product 10 according to a number of variations. In a number of variations, the product 10 may be a vehicle 10, may include a vehicle, or may be a component of a vehicle. In a number of variations, the product 10 may be a vehicle 10, which may be an automobile, motorcycle, spacecraft, watercraft, locomotive, or may be another type. In a number of variations, the vehicle 10 may be an electric vehicle, hybrid vehicle, such as hybrid internal combustion engine vehicles, fuel cell system vehicle, etc. In a number of variations, the product 10 may include at least one electrochemical device 112. In a number of variations, the electrochemical device 112 may be a battery, supercapacitor, or may be another type. In a number of variations, the product 10 may include a plurality of electrochemical devices 112. In a number of variations, the product 10 may include at least one power source 114. In a number of variations, the product 10 may include a plurality of power sources 114. In a number of variations, the electrochemical device 112 may be a lithium ion electrochemical device, nickel metal hydride (NiMH) electrochemical device, lead acid electrochemical device, lithium polymer electrochemical device, silicon electrochemical device, or may be another type. In a number of variations, the vehicle 10 may be any electric only vehicle that only employs an electrochemical device 112 as the lone power source. In a number of variations, the electrochemical device 112 is a vehicle battery component.

In a number of variations, the product 10 may include a controller 116 that may be intended to represent all of the control modules and devices necessary for the proper operation and control of the power provided by the electrochemical device 112 and the power source 114 to drive the vehicle 10, recharge the electrochemical device 112 by the power source 114 or regenerative braking, and determine the electrochemical device state of charge (SOC) and state of power (SOP) capability. In a number of variations, the controller 116 may obtain, derive, deduce, monitor, and/or process a set of parameters or conditions associated with electrochemical device 112. These parameters may include, without limitation: current; voltage; SOC; SOP; state of health (SOH); electrochemical device internal resistances; electrochemical device internal reactances; temperature; and power output of the electrochemical device 112. In a number of variations, the controller 116 may be an electrochemical device state estimator. In a number of variations, the product 10 or controller 116 may include an electrochemical device state estimator (BSE).

In a number of variations, the product 10 may include at least one sensor 12. In a number of variations, the sensor 12 may be in contact with or in close proximity to the electrochemical device 112. In a number of variations, the sensor 12 may be operatively connected to the electrochemical device 112. In a number of variations, the sensor 12 may monitor and gather measurements of at least one parameter or condition within the electrochemical device 112. In a number of variations, the sensor 12 may be in contact with or in close proximity to the controller 116. In a number of variations, the sensor 12 may be operatively connected to the controller 116. In a number of variations, the sensor 12 may transmit the measurements of at least one parameter or condition of the electrochemical device 112 to the controller 116. In a number of variations, the sensor may transmit measurements wirelessly or with a wire connection. In a number of variations, the sensor 12 may be constructed and arranged to provide measurements that derive both state of charge and temperature of an electrochemical device 112 simultaneously. In a number of variations, the controller 116 may be operatively connected to the sensor 12 wherein the controller 116 may be constructed and arranged to derive at least one of the temperature, the state of charge, or state of power of the electrochemical device 112 from at least one of the measurements provided by the sensor 12. In a number of variations, the controller 116 may be constructed and arranged to derive at least one of the temperature, the state of charge, or state of power of the electrochemical device 112 from at least one of the measurements provided by the sensor 12 simultaneously. In a number of variations, the sensor 12 for the electrochemical device 112 may be dynamically tracked to determine a condition of the electrochemical device 112. The controller 116 may be suitably configured to receive a transmission of the condition of the electronic device 112 from the sensor 12. The controller 116 may use this information to control the operation of the product 10 or electrochemical device 112.

In a number of variations, the controller 116 may comprise any type of control module or vehicle controller known in the art, and can be equipped with nonvolatile memory, random access memory (RAM), discrete and analog input/output (I/O), a central processing unit, and/or communications interfaces for networking within an automotive communications network. In a number of variations the controller 116 and possibly other illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. A processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration. Moreover, the steps of a method or algorithm described in connection with the variations disclosed herein may be embodied directly in hardware, in firmware, in a software module executed by a processor, or in any practical combination thereof. In a number of variations, a software module may reside in RAM memory, flash memory, ROM memory, EPROM memory, EEPROM memory, registers, a hard disk, a removable disk, a CD-ROM, or any other form of storage medium known in the art. In this regard, an exemplary storage medium may be coupled to a processor such that the processor can read information from, and write information to, the storage medium. In a number of variations, the storage medium may be integral to the processor.

In a number of variations, the subject matter and certain aspects of the embodiments thereof may be described in the general context of computer-executable instructions, such as program modules, executed by one or more computing modules, controllers, or other devices. In a number of variations, program modules may include routines, programs, objects, components, data structures, and/or other elements that perform particular tasks or implement particular abstract data types. In a number of variations, the functionality of the program modules may be combined or distributed as desired in various variations. In a number of variations, a computing device that performs computer-executable instructions may include at least some form of computer readable media. Computer readable media may be any available media that can be accessed by a computing device and/or by applications executed by a computing device.

Figure 2A:
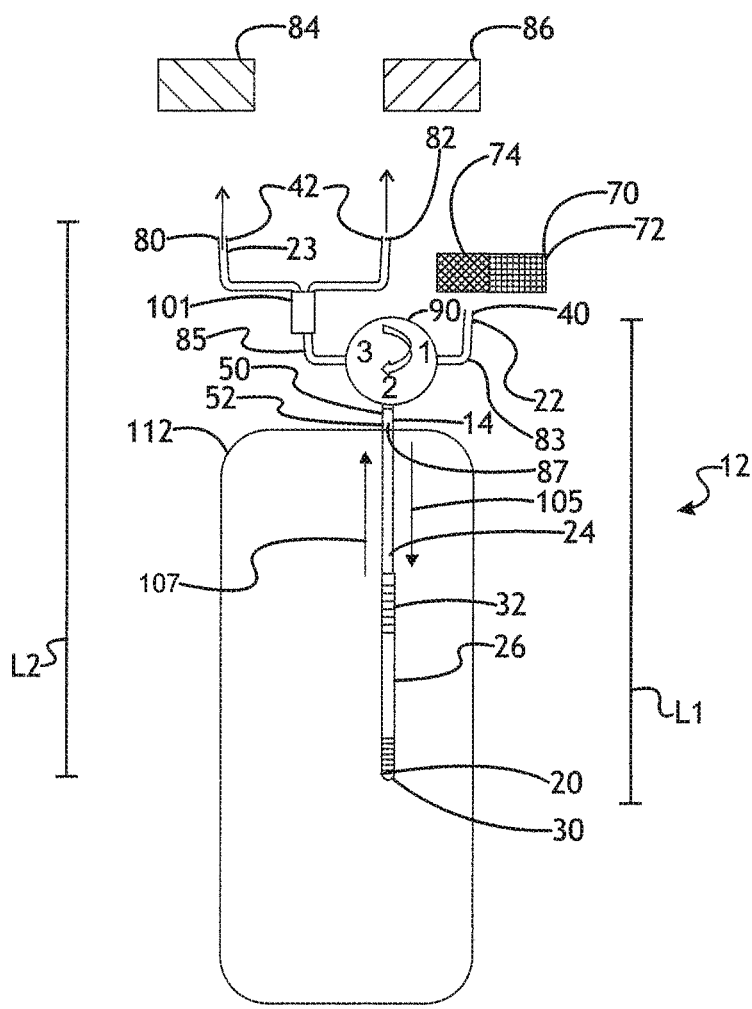
FIG. 2A illustrates a simplified plan view of a product comprising a sensor and an electrochemical device according to a number of variations.
Figure 2B:
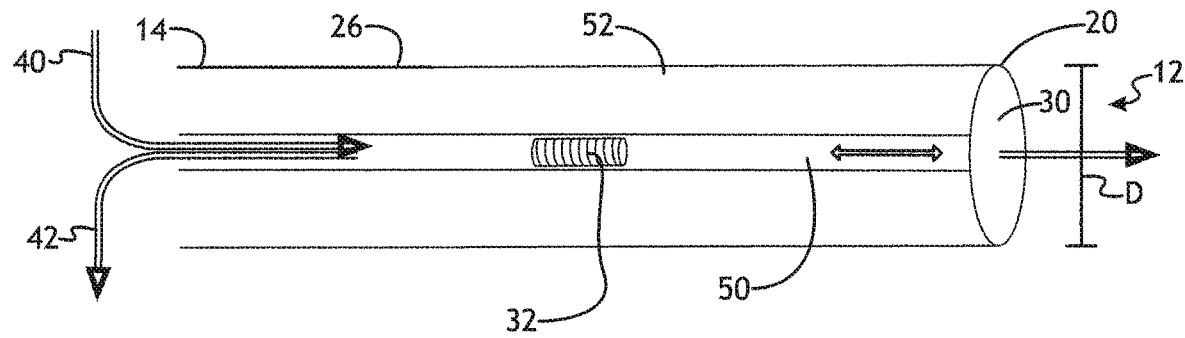
FIG. 2B illustrates a simplified plan view of a product comprising a sensor according to a number of variations.

In a number of variations, as shown in FIGS. 2A-2B, the sensor 12 may include a fiber 14. In a number of variations, the sensor 12 may include an optical fiber 14. In a number of variations, the fiber 14 may include a first end 20, a short second end 22, a long second end 23 and a longitudinal midsection 24. In a number of variations, the distance from the first end 20 to the short second end 22 may be length L1. In a number of variations, the distance from the first end 20 to the long second end 23 may be length L2. In a number of variations, the fiber 14 may have a radial edge 26. In a number of variations, as shown in FIG. 2B, the fiber 14 may have a core 50. In a number of variations, as shown in FIG. 2B, the fiber 14 may have a cladding 52. In a number of variations, the fiber 14 may have a cross-sectional shape comprising at least one of a circle, an oval, an ellipse, a polygon, or may be another shape. In a number of variations, the fiber 14 may have a cross-sectional diameter or width D.

In a number of variations, the fiber 14 may be hollow. In a number of variations, the fiber 14 may include a hollow section or core 50 and may include a solid section or cladding 52 along its longitudinal midsection 24. In a number of variations, the first end 20 may be open or closed. In a number of variations, the short second end 22 may be open or closed. In a number of variations, the long second end 23 may be open or closed. In a number of variations, the fiber may be made of a material including, but not limited to, silica, plastic, fluoride glass (such as, but not limited to, phosphorus pentoxide, or may be another type), phosphate glass (such as, but not limited to, HMFG, ZBLAN glass, or may be another type), fluorozirconate, fluoroaluminate, chalcogenide glasses, crystalline materials, sapphire, fiberglass, [combinations thereof or may be another material. In a number of variations, the fiber 14 may be doped with a doping material comprising at least one of germanium dioxide, aluminium oxide, fluorine, boron trioxide, aluminosilicate, germanosilicate, phosphosilicate, borosilicate glass, combinations thereof or may be another material. In a number of variations, the fiber 14 may be formed or manufactured through any known method including, but not limited to, drawing, preforming, or may be another type. In a number of variations, the fiber 14 may be a single mode fiber. In a number of variations, the fiber 14 may be a multi-mode fiber.

In a number of variations, as shown in FIGS. 2A-2B, the product 10, sensor 12 or first end 20 of the fiber 14 may include a semiconductor material 30. In a number of variations, the semiconductor material 30 may close the first end 20 of the fiber 14. In a number of variations, the semiconductor material 30 may be a coating on at least a portion of the first end 14 of the fiber 14. In a number of variations, the semiconductor material 30 may be a coating that may cover or leave open the first end 20 of the fiber 14. In a number of variations, the semiconductor material 30 may include a material including at least one of a material comprising at least one of Diamond (C), Silicon (Si), Germainium (Ge), Gray tin (Sn), Silicon carbide (SiC), Sulfur (S), Selenium (Se), Tellurium (Te), Boron nitride (BN), Boron phosphide (BP), Boron arsenide (BAs), Aluminum nitride (AlN), Aluminum phosphide (AlP), Aluminum arsenide (AlAs), Aluminum antimonide (AlSb), Gallium nitride (GaN), Gallium phosphide (GaP), Gallium arsenide (GaAs), Gallium antimonide (GaSb), Indium nitride (InN), Indium phosphide (InP), Indium arsenide (InAs), Indium antimonide (InSb), Cadmium selenide (CdSe), Cadmium sulfide (CdS), Cadmium telluride (CdTe), Zinc oxide (ZnO), Zinc selenide (ZnSe), Zinc sulfide (ZnS), Zinc Telluride (ZnTe), Cuprous chloride (CuCl), Copper sulfide ($Cu_2S$), Lead selenide (PbSe), Lead (II) sulfide (PbS), Lead telluride (PbTe), Tin sulfide (SnS), Tin sulfide ($SnS_2$), Tin telluride (SnTe), Lead tin telluride (PbSnTe), Thallium tin telluride ($Tl_2SnTe_5$), Thallium germanium telluride ($Tl_2GeTe_5$), Bismuth telluride ($Bi_2Te_3$), Cadmium phosphide ($Cd_3P_2$), Cadmium arsenide ($Cd_3As_2$), Cadmium antimonide ($Cd_3Sb_2$), Zinc phosphide ($Zn_3P_2$), Zinc arsenide ($Zn_3As_2$), Zinc antimonide ($Zn_3Sb_2$), Titanium dioxide ($TiO_2$), Copper (I) oxide ($Cu_2O$), Copper (II) oxide (CuO), Uranium dioxide ($UO_2$), Uranium trioxide ($UO_3$), Bismuth trioxide ($Bi_2O_3$), Tin dioxide ($SnO_2$), Barium titanate ($BaTiO_3$), Strontium titanate ($SrTiO_3$), Lithium niobate ($LiNbO_3$), Lanthanum copper oxide ($La_2CuO_4$), Lead (II) iodide ($PbI_2$), Molybdenum disulfide ($MoS_2$), Gallium selenide (GaSe), Tin sulfide (SnS), Bismuth sulfide ($Bi_2S_3$), Gallium manganese (GaMnAs), Indium manganese arsenide (InMnAs), Cadmium manganese telluride (CdMnTe), Lead manganese telluride (PbMnTe), Lanthanum calcium manganite ($La_{0.7}Ca_{0.3}MnO_3$), Iron (II) oxide (FeO), Nickel (II) oxide (NiO), Europium (II) oxide (EuO), Europium (II) sulfide (EuS), Chromium (III) bromide ($CrBr_3$), Copper indium selenide ($CuInSe_2$), Silver gallium sulfide ($AgGaS_2$), Zinc silicon phosphide ($ZnSiP_2$), Arsenic sulfide ($As_2S_3$), Platinum silicide (PtSi), Bismuth (III) iodide ($BiI_4$), Mercury (II) iodide ($HgI_2$), Thallium (I) bromide (TlBr), Silver sulfide ($Ag_2S$), Iron disulfide ($FeS_2$), Copper zinc tin sulfide (CZTS, CZAS), Copper tin sulfide ($Cu_2SnS_3$), Silicon-germanium, Silicon-tin, Aluminum gallium arsenide, Indium gallium arsenide, Indium gallium phosphide, Aluminum indium arsenide, Aluminum indium antimonide, Gallium arsenide nitride, Gallium arsenide phosphide, Gallium arsenide, antimonide, Aluminum gallium nitride, Aluminum gallium phosphide, Indium gallium nitride, Indium arsenide antimonide, Indium gallium antimonide, Aluminum gallium indium phosphide, Aluminum gallium arsenide phosphide, Indium gallium arsenide, Indium arsenide antimonide phosphide, Aluminum indium arsenide phosphide, Aluminum gallium arsenide nitride, Indium gallium arsenide nitride, Indium aluminum arsenide nitride, Gallium arsenide antimonide nitride, Gallium indium nitride arsenide antimonide, Gallium indium arsenide antimonide phosphide, Cadmium zinc telluride, Mercury cadmium telluride, Mercury zinc telluride, Mercury zinc selenide, Copper indium gallium selenide, or may include another type. In a number of variations, the semiconductor material 30 may be doped with a material including, but not limited to, phosphorous, arsenic, antimony, silicon, aluminum, magnesium, carbon, oxygen or may be doped with a different material. In a number of variations, the semiconductor material 30 may be coated on the first end 20 of the fiber 14 through any process known in the art including, but not limited to, chemical vapor deposition processes, physical vapor deposition processes, sputtering, painting, spraying, dip coating, spray coating, flow coating, or may be formed using another deposition process. In a number of variations, the semiconductor material 30 may be a coating that closes the tip of the first end 20 of the fiber 14. In a number of variations, the semiconductor material 30 may cover at least one of the core 50 or cladding 52 of the fiber 14.

In a number of variations, as shown in FIGS. 2A-2B, the product 10, sensor 12, or fiber 14 may include at least one grating 32. In a number of variations, the grating 32 may be at the first end 20 of the fiber 14. In a number of variations, the grating 32 may be at the short second end 22 of the fiber 14. In a number of variations, the grating 32 may be at the long second end 23 of the fiber 14. In a number of variations, the grating 32 may be placed anywhere along the longitudinal midsection 24 of the fiber 14. In a number of variations, the grating 32 may be at a radial edge 26 of the fiber 14. In a number of variations, the grating 32 may be placed in the core 50 of the fiber 50. In a number of variations, the grating 32 may be placed in the cladding 52 of the fiber 14. In a number of variations, the grating 32 may be a Fiber Bragg grating or a Bragg grating. In a number of variations, the grating 32 may be a standard grating (including but not limited to a type I grating, a type IA grating, a type IIA grating, or may be another type), a generated grating (including but not limited to a type II grating, or may be another type). In a number of variations, the grating 32 may be a uniform fiber Bragg grating, a chirped fiber Bragg grating, a tilted fiber Bragg grating, a superstructure fiber Bragg grating, an apodized grating, a period grating, or may be another type. In a number of variations, the grating 32 may be inscribed within the core 50 of the fiber 14.

In a number of variations, as shown in FIG. 2A, the fiber 14 may have a short second end 22. In a number of variations, the short second end 22 may have an input port 40. In a number of variations, the input port 40 may have a input port path 83 for a light wave to travel through. In a number of variations, as shown in FIG. 2A, the fiber 14 may have a long second end 23. In a number of variations, the long second end 23 may have an output port 42. In a number of variations, the input port 40 may include an input hybrid light source 70. In a number of variations, the input hybrid light source may include a narrow band light source 72 and a wide band input light source 74. In a number of variations, the output port 42 may include a first output port path 80, for a light wave to travel through, and a second output port path 82, for a light wave to travel through. In a number of variations, an optical splitter 101 may be used to split light between the first output port path 80 and the second output port path 82 from a third output port path 85. In a number of variations, the first output port path 80 may include a spectrometer 84. In a number of variations, the spectrometer 84 may be constructed and arranged or capable of measuring wavelength shift of the wide band light from the grating 32 of the sensor 12. In a number of variations, the second output port path 82 may include a narrow band path detector 86. In a number of variations, the narrow band path detector 86 may be constructed and arranged or capable of measuring the power output of the narrow band light of the sensor 12 as a function of time.

In a number of variations, as shown in FIG. 2A, the sensor 12 may have an optical circulator 90. In a number of variations, the optical circulator 90 may be between the first end 20 and short second end 22 of the fiber. In a number of variations, the optical circulator 90 may be between the first end 20 and long second end 23 of the fiber. In a number of variations, the optical circulator 90 may be between the short second end 22 and the long second end 23 of the fiber. In a number of variations, the optical circulator may divide or ration light between the input port path 83 and a sensor input/out path 87 of light entering and leaving the fiber located within or in contact with the electrochemical device 112 as shown in FIG. 2A. In a number of variations, the optical circulator 90 may split the input port path 83 from the first output port path 80 and second output port path 82 via the third output port path 85. In a number of variations, the optical circulator 90 may split the sensor input/output path 87 from the first output port path 80 and second output port path 82. In a number of variations, entering light 105 may enter the sensor input/output path 87 and circulate through at least one grating 32 or semiconductor 30 and become refracted light 107, which may move back through the sensor input/output path 87 to the optical circulator 90 as indicated by arrows which indicate the movement of light through the sensor 12 or the sensor input/output path 87. In a number of variations, the optical circulator 90 may deliver the input of at least one of the input hybrid light source 70, the narrow band light from the narrow band light source 72, or the wide band light from the wide band light source 74 to the sensor input/output path 87. In a number of variations, the optical circulator 90 may deliver the input of at least one of the input hybrid light source 70, the narrow band light from the narrow band light source 72, or the wide band light from the wide band light source 74 to the sensor input/output path 87 to become entering light 105. In a number of variations, the optical circulator 90 may deliver the refracted light 107 from the sensor input/output path 87 to the third output port path 85. In a number of variations, the splitter 101 may ration the refracted light 107 between the first output port path 80 to the spectrometer 84, and the second output port path 82 to the narrow band path detector 86. In an number of variations, the splitter may ration the refracted light 107 between a percentage of 0 and 100% between the first output port path 80 and the second output port path 82. In a number of variations, the refracted light 87 may be split by wavelength such the refracted light 107 entering the splitter 101 through the third output port path 85 will be split by its wavelength between the first output port path 80 to the spectrometer 84, and the second output port path 82 to the narrow band path detector 86.

In a number of variations, as shown in FIG. 2A and described previously, the sensor 12 may be placed in contact with the electrochemical device 112. In a number of variations, the sensor 12 may be placed within the electrochemical device 112 itself. In a number of variations, the sensor 12 may be placed between, next to, or within a separator (not shown) within the electrochemical cell. In a number of variations the sensor 12 may send both narrow band light from the narrow band light source 72 and wide band light from the wide band light source 74 through the input port 50 and into the longitudinal midsection 26 via the input/output port path 87. In a number of variations, the hybrid light may reach the first end 20 of the sensor 12. In a number of variations, the hybrid light may reach the output port 42 of the sensor 12 and exit the sensor at the first output port path 80 and be measured in the spectrometer 84. In a number of variations, the hybrid light may reach the output port 42 of the sensor 12 and exit the sensor at the second output port path 82 and be measured in the narrow band path detector 86. In a number of variations, the grating 32 may shift the wavelength of the light through the sensor 12. In a number of variations, the hybrid light, narrow band light, or wide band light may be reflected in the grating 32 such that the wavelength of the light may be shifted and the resulting wavelength shift may be measured through the spectrometer 84. In a number of variations, the narrow band light may compatible with the semiconductor 30 to provide a measured power output as a function of time, which may be measured by the narrow band path detector 86. In a number of variations, the sensor 12 may transmit or feed values for wavelength shift and power output to the controller 116. In a number of variations, the controller 116 may determine the strain and temperature of the electrochemical cell 112 from these values. In a number of variations, the power as a function of time may be used to determine the temperature and the change in wavelength and temperature can be used to determine the strain per equations 1 and 2 below where P is the power output of the narrow band light as a function of time, W is the mechanical work of the narrow band light, T is the temperature the controller 116 is deriving for the electrochemical device 112, Δλ is the change in wavelength of the reflected light from the grating, L is the strain of the reflected light from the grating, and SOC is the state of charge of the electrochemical device 112:

$$P = W(T) \rightarrow T = W^{-1}(P) \tag{1}$$

$$\Delta\lambda = L(T, SOC) \rightarrow SOC = L^{-1}(W^{-1}(P), \Delta\lambda) \tag{2}$$

In a number of variations, the strain and temperature determined in the controller form the measurements provided by the sensor may be correlated from the measured narrow band power output and wavelength shift through the use of a look-up table. In a number of variations, the strain and temperature determined in the controller 116 from the measurements provided by the sensor 12 may be fed into a temperature compensated state of charge look-up table to determine a first state of charge of the electrochemical device 112 $SOC_1$. In a number of variations, $SOC_1$ may be formulated from a calibrated relationship between strain and state of charge of the electrochemical device 112. In a number of variations, the controller 116 or sensor 12 may also measure at least one of current $I_m$ or voltage $V_m$ of the electrochemical device 112. In a number of variations, the temperature and measured current and voltage may be fed into a battery equivalent circuit model (ECM) used to determine a second state of charge of the electrochemical device 112 $SOC_2$. In a number of variations, $SOC_2$ may be formulated from coulomb counting of the electrochemical device 112. In a number of variations, the ECM may also determine a predicted current $I_p$ and/or voltage $V_p$ for the electrochemical device 112. In a number of variations, the predicted current $I_p$ and voltage $V_p$ and the state of charge $SOC_2$ from the battery equivalent circuit model (ECM) may be fed along with the measured current $I_m$ and voltage $V_m$ and the determined state of charge $SOC_1$ from the lookup table into a Kalman Filter estimator which compares the measured current $I_m$, voltage $V_m$, & $SOC_1$ from the look-up table provided by the sensor and compares to the corresponding values for predicted current $I_p$, voltage $V_p$, and the state of charge $SOC_2$ from the battery equivalent circuit model (ECM) and computes corrected parameters and full state estimates of parameters for the electrochemical device 112, which may be fed in a feedback loop to the battery equivalent circuit model. In a number of variations, these Kalman filter estimator may determine a corrected $SOC_3$ which may be used to determine an estimated state of power (SOP) for the electrochemical device through use of a state of power estimator. In a number of variations, the corrected state of charge $SOC_3$ and state of power SOP may be used to provide corrected parameters for the battery equivalent circuit model (ECM) in a feedback loop. In a number of variations, the state of charge $SOC_3$ and state of power SOP may be feed into a battery management system (BSM) to provide a commanded current or voltage to the battery equivalent circuit model (ECM), the sensor 12, and/or the electrochemical device 112. In a number of variations, the battery state estimator (BSE) may include all of these components (including, but not limited to, the electrochemical device 112, sensor 12, battery equivalent circuit model (ECM), Kalman Filter Estimator, State of Power Estimator, and/or Battery Management System) and all of these components may be present in the controller 116. In a number of variations, values for predicted voltage $V_p$, predicted current $I_p$, predicted state of charge $SOC_1$, $SOC_2$, $SOC_3$, state of power SOP, or a number of values may be processed using any number of linear regression methods which may include but are not limited to the use of a Kalman filter, WRLS analysis, or any other method known in the art. In such variations, the equivalent circuit may be constructed to operate in a manner approximating the processed data.

In a number of variations, the sensor 12 or system may provide a better measurement of electrochemical device 112 parameters such as state of charge, temperature, or state of power. In a number of variations, this may be done at higher and lower temperatures with improved accuracy. In a number of variations, one may avoid problems with accurately displaying these conditions due to hysteresis with the use of the sensor 12 or system. In a number of variations, this may improve the safety protection and/or warranty for the electrochemical device 112. Accurate knowledge of internal electrochemical device parameters may be important for purposes of controlling the electrochemical device systems of hybrid electric (and purely electric) vehicles. The methodology described herein adaptively extracts measurements and/or estimations of the internal parameters for electrochemical devices 112. The advantages of the proposed methodology over existing techniques are better adaptation to variations in the environment, electrochemical device state, and driving conditions, higher computational efficiency, and lower implementation cost including but not limited to, more accurate power prediction models for better power management in the electrochemical device 112 and the product 10 through the controller 116. In a number of variations, this new methodology may provide better power prediction for better power management in an electrochemical device 112 which may benefit range, performance and life of the electrochemical device 112.

In a number of variations, a system may be provided. In a number of variations, the system may include an electrochemical device 112. In a number of variations, the system could include at least one sensor 12 contacting or in close proximity to the electrochemical device 112. In a number of variations, the sensor 12 may be operatively connected to the electrochemical device 112. In a number of variations, the sensor 12 may include an optical fiber 14 comprising a first end 20 comprising a semiconductor material 30. In a number of variations, the sensor 12 may include a second end 22. In a number of variations, the sensor may include a longitudinal midsection 24 comprising a grating 32. In a number of variations, the sensor 12 may be constructed and arranged to provide measurements that derive both state of charge and temperature of an electrochemical device 112 simultaneously. In a number of variations, the system may further include a controller 116. In a number of variations, the controller 116 may be constructed and arranged to derive at least one of the temperature, state of charge, or state of power of the electrochemical 116 device from at least one of the measurements provided by the sensor 112.

A method is described according to a number of variations. In a number of variations, the method may include a step of providing an electrochemical device 112, at least one sensor 12 contacting or in close proximity to an electrochemical device 112, the sensor 12 comprising an optical fiber 14 comprising a first end 20 comprising a semiconductor material 30, a second end 22, and a longitudinal midsection 24 comprising a grating 32, wherein the sensor 12 is constructed and arranged to provide measurements that derive both state of charge and temperature of an electrochemical device 112 simultaneously, and a controller 116 operatively connected to the sensor 12 wherein the controller 116 is constructed and arranged to derive at least one of the temperature, state of charge, or state of power of the electrochemical device 112 from at least one of the measurements provided by the sensor 12. In a number of variations, the method may include a step of determining the measurements that derive both state of charge and temperature of the electrochemical device 112 through the sensor 12. In a number of variations, the method may include a step of transmitting the measurements of the electrochemical device 112 from the sensor 12 to the controller 116. In a number of variations, the method may include a step of deriving at least one of the temperature, state of charge and state of power of the electrochemical device 112 through the controller 116.

The following description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may include a product comprising: at least one sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously.

Variation 2 may include a product as set forth in Variation 1 wherein the semiconductor material comprises Gallium Arsenide.

Variation 3 may include a product as set forth in any of Variations 1-2 wherein the grating comprises a Fiber Bragg grating.

Variation 4 may include a product as set forth in any of Variations 1-3 wherein the second end comprises an input port and an output port.

Variation 5 may include a product as set forth in Variation 4 wherein the input port comprises an input hybrid light source comprising a narrow band light source and a wide band light source.

Variation 6 may include a product as set forth in any of Variations 4-5 wherein the output port comprises a first output port path detector comprising a spectrometer capable of measuring wavelength shift of the wide band light from the grating and a second output port path detector comprising a narrow band light photo detector capable of measuring the power output of the narrow band light as a function of time.

Variation 7 may include a product as set forth in any of Variations 1-6 wherein the product further comprises a controller operatively connected to the sensor wherein the controller is constructed and arranged to derive at least one of the temperature, the state of charge, or state of power of the electrochemical device from at least one of the measurements provided by the sensor.

Variation 8 may include a product as set forth in any of Variations 1-7 wherein the sensor further comprises an optical circulator to deliver light to or from at least one of the semiconductor material or the grating.

Variation 9 may include a product as set forth in any of Variations 1-8 wherein the electrochemical device is a vehicle battery component.

Variation 10 may include a system comprising: an electrochemical device, at least one sensor contacting or in close proximity to the electrochemical device, the sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously, and a controller operatively connected to the sensor wherein the controller is constructed and arranged to derive at least one of the temperature, state of charge, or state of power of the electrochemical device from at least one of the measurements provided by the sensor.

Variation 11 may include a method comprising: providing an electrochemical device, at least one sensor contacting or in close proximity to an electrochemical device, the sensor comprising an optical fiber comprising a first end comprising a semiconductor material, a second end, and a longitudinal midsection comprising a grating, wherein the sensor is constructed and arranged to provide measurements that derive both state of charge and temperature of an electrochemical device simultaneously, and a controller operatively connected to the sensor wherein the controller is constructed and arranged to derive at least one of the temperature, state of charge, or state of power of the electrochemical device from at least one of the measurements provided by the sensor; determining the measurements that derive both state of charge and temperature of the electrochemical device through the sensor; transmitting the measurements of the electrochemical device from the sensor to the controller; and deriving at least one of the temperature, state of charge and state of power of the electrochemical device through the controller.

Variation 12 may include a method as set forth in Variation 11 wherein the second end comprises an input port and an output port.

Variation 13 may include a method as set forth in any of Variations 11-12 wherein the input port comprises an input hybrid light source comprising a narrow band light source and a wide band light source.

Variation 14 may include a method as set forth in Variation 13 wherein the output port comprises a first output port path detector comprising a spectrometer capable of measuring wavelength shift of the wide band light of the grating and a second output port path detector comprising a narrow band light photo detector capable of measuring the power output of the narrow band light as a function of time.

Variation 15 may include a method as set forth in Variation 14 wherein the controller derives the temperature of the electrochemical device at the first end of the sensor from the sensor measurement of power output of the narrow band light as a function of time.

Variation 16 may include a method as set forth in Variation 15 wherein the controller derives the strain of the electrochemical device at the grating of the sensor from the sensor measurement of wavelength shift of the wide band light of the grating and the derived temperature.

Variation 17 may include a method as set forth in any of Variations 11-16 wherein at least one of the sensor or controller also measures the voltage and current of the electrochemical device.

Variation 18 may include a method as set forth in Variation 17 wherein the controller derives the state of charge of the electrochemical device from at least one of the measured voltage, current, derived temperature and derived strain.

Variation 19 may include a method as set forth in Variation 18 wherein the controller predicts the state of power of the electrochemical device from the state of charge and derived temperature.

Variation 20 may include a method as set forth in any of Variations 11-19 wherein the sensor further comprises an optical circulator to deliver light to or from at least one of the semiconductor material or the grating.

The above description of select variations within the scope of the invention is merely illustrative in nature and, thus, variations or variants thereof are not to be regarded as a departure from the spirit and scope of the invention.

What is claimed is:
1. A product comprising:
at least one sensor comprising an optical fiber, wherein the optical fiber comprises:
a first end, the first end having a tip without a grating and the tip being doped with a semiconductor material that closes the tip of the first end;
a short second end, the short second end having an input port with an input port path for a light wave to travel through;

a long second end, the long second end having an output port with a first output port path for the light wave to travel through and a second output port path for the light wave to travel through; and a longitudinal midsection comprising a grating, the sensor further comprising:

an optical splitter configured to split light between the first output port path and the second output port path from a third output port path; and an optical circulator between the short second end and the long second end of the optical fiber for delivering light to or from at least one of the semiconductor material or the grating, wherein the sensor is constructed and arranged to provide measurements that derive both state of charge and temperature of an electrochemical device simultaneously.

2. The product as set forth in claim 1, wherein the semiconductor material comprises Gallium Arsenide.

3. The product as set forth in claim 1, wherein the grating comprises a Fiber Bragg grating.

4. The product as set forth in claim 1, wherein the input port comprises an input hybrid light source comprising a narrow band light source and a wide band light source.

5. The product as set forth in claim 1, wherein the output port comprises a first output port path detector comprising a spectrometer capable of measuring wavelength shift of a wide band light from the grating and a second output port path detector comprising a narrow band light photo detector capable of measuring power output of a narrow band light as a function of time.

6. The product as set forth in claim 1, wherein the product further comprises a controller operatively connected to the sensor wherein the controller is constructed and arranged to derive at least one of the temperature, the state of charge, or state of power of the electrochemical device from at least one of the measurements provided by the sensor.

7. The product as set forth in claim 1, wherein the electrochemical device is a battery component.

8. A system comprising:

an electrochemical device;

at least one sensor contacting or in close proximity to the electrochemical device, the sensor comprising:

an optical fiber comprising:

a first end, the first end having a tip without a grating and the tip being doped with a semiconductor material that closes the tip of the first end;

a short second end, the short second end having an input port with an input port path for a light wave to travel through;

a long second end, the long second end having an output port with a first output port path for the light wave to travel through and a second output port path for the light wave to travel through; and a longitudinal midsection comprising a grating, the sensor further comprising:

an optical splitter configured to split light between the first output port path and the second output port path from a third output port path; and an optical circulator between the short second end and the long second end of the optical fiber for delivering light to or from at least one of the semiconductor material or the grating, wherein the sensor is constructed and arranged to provide measurements that derive both state of charge and temperature of an electrochemical device simultaneously; and a controller operatively connected to the sensor wherein the controller is constructed and arranged to derive at least one of the temperature, state of charge, or state of power of the electrochemical device from at least one of the measurements provided by the sensor.

9. A method comprising:

providing an electrochemical device, at least one sensor contacting or in close proximity to the electrochemical device, and a controller operatively connected to the sensor, wherein the sensor comprises:

an optical fiber comprising:

a first end, the first end having a tip without a grating and the tip being doped with a semiconductor material that closes the tip of the first end;

a short second end, the short second end having an input port with an input port path for a light wave to travel through;

a long second end, the long second end having an output port with a first output port path for the light wave to travel through and a second output port path for the light wave to travel through; and a longitudinal midsection comprising a grating, the sensor further comprising:

an optical splitter configured to split light between the first output port path and the second output port path from a third output port path; and an optical circulator between the short second end and the long second end of the optical fiber for delivering light to or from at least one of the semiconductor material or the grating, wherein the sensor is constructed and arranged to provide measurements that derive both state of charge and temperature of an electrochemical device simultaneously, and wherein the controller is constructed and arranged to derive at least one of the temperature, state of charge, or state of power of the electrochemical device from at least one of the measurements provided by the sensor;

determining the measurements that derive both state of charge and temperature of the electrochemical device through the sensor;

transmitting the measurements of the electrochemical device from the sensor to the controller; and deriving at least one of the temperature, state of charge and state of power of the electrochemical device through the controller.

10. The method as set forth in claim 9, wherein the input port comprises an input hybrid light source comprising a narrow band light source and a wide band light source.

11. The method as set forth in claim 10, wherein the output port comprises a first output port path detector comprising a spectrometer capable of measuring wavelength shift of a wide band light of the grating and a second output port path detector comprising a narrow band light photo detector capable of measuring power output of a narrow band light as a function of time.

12. The method as set forth in claim 11, wherein the controller derives the temperature of the electrochemical device at the first end of the sensor from the sensor measurement of power output of the narrow band light as a function of time.

13. The method as set forth in claim 12, wherein the controller derives a strain of the electrochemical device at the grating of the sensor from the sensor measurement of wavelength shift of the wide band light of the grating and the derived temperature.

14. The method as set forth in claim 13, wherein at least one of the sensor or controller also measures voltage and current of the electrochemical device.

15. The method as set forth in claim 14, wherein the controller derives the state of charge of the electrochemical device from at least one of the measured voltage, current, derived temperature and derived strain.

16. The method as set forth in claim 15, wherein the controller predicts the state of power of the electrochemical device from the state of charge and derived temperature.

* * * * *